(12) United States Patent
Yap et al.

(10) Patent No.: US 6,781,533 B2
(45) Date of Patent: Aug. 24, 2004

(54) OPTICALLY SAMPLED DELTA-SIGMA MODULATOR

(75) Inventors: Daniel Yap, Thousand Oaks, CA (US); Henrik T. Jensen, Brentwood, CA (US)

(73) Assignee: HRL Laboratories, LLC., Malibu, CA (US)

( * ) Notice: Subject to any disclaimer, the term of this patent is extended or adjusted under 35 U.S.C. 154(b) by 0 days.

(21) Appl. No.: 10/281,331

(22) Filed: Oct. 25, 2002

(65) Prior Publication Data

US 2003/0128143 A1 Jul. 10, 2003

(Under 37 CFR 1.47)

Related U.S. Application Data

(60) Provisional application No. 60/332,369, filed on Nov. 15, 2001.

(51) Int. Cl.[7] .................................................. H03M 3/00
(52) U.S. Cl. ........................................ 341/143; 341/144
(58) Field of Search ................................ 341/143, 144, 341/118, 120, 137

(56) References Cited

U.S. PATENT DOCUMENTS

| | | | |
|---|---|---|---|
| 3,516,728 A | 6/1970 | Fenner ........................ 350/160 |
| 5,010,346 A | 4/1991 | Hamilton et al. ............. 341/17 |
| 5,111,517 A | 5/1992 | Riviere ........................ 385/11 |
| 5,142,286 A | * 8/1992 | Ribner et al. ............... 341/143 |
| 5,196,852 A | 3/1993 | Galton ........................ 341/143 |
| 5,253,309 A | 10/1993 | Nazarathy et al. ............. 385/4 |
| 5,565,867 A | 10/1996 | Tiemann ..................... 341/143 |
| 5,621,408 A | 4/1997 | Cake et al. .................. 341/143 |
| 5,955,875 A | 9/1999 | Twichell et al. .............. 324/96 |
| 6,218,972 B1 | * 4/2001 | Groshong ................... 341/143 |
| 6,246,350 B1 | 6/2001 | Yap ............................ 341/137 |
| 6,259,389 B1 | * 7/2001 | McGrath .................... 341/120 |
| 6,326,910 B1 | 12/2001 | Hayduk et al. ............. 341/137 |
| 6,422,985 B1 | 7/2002 | Heitmann .................... 341/137 |
| 6,525,682 B2 | * 2/2003 | Yap et al. .................... 341/137 |

FOREIGN PATENT DOCUMENTS

EP 0 734 125 A1 9/1996

OTHER PUBLICATIONS

U.S. patent application Ser. No. 10/280,416, Yap et al., filed Oct. 25, 2002.

Bridges, W.B., et al., "Distoration on Linearized Electroptic Modulators," *IEEE Transactions on Microwave Theory and Techniques*, vol. 43, No. 9, pp. 2184–2197 (Sep. 1995).

Galton, I., et al., "Delta–Sigma Modulator Based A/D Conversion without Oversampling," *IEEE Transactions on Circuits and Systems—II: Analog and Digital Signal Processing*, vol. 42, No. 12, pp. 773–784 (Dec. 1995).

Jenson, J.F., et al., "A 3.2–Ghz Second–Order Delta–Sigma Modulator Implemented on HBT Technology," *IEEE Jouranl of Solid–State Circuits*, vol. 30, No. 10, pp.1119–1127 (Oct. 1995).

(List continued on next page.)

*Primary Examiner*—Brian Young
*Assistant Examiner*—Joseph Lauture
(74) *Attorney, Agent, or Firm*—Ladas & Parry

(57) ABSTRACT

A delta-sigma modulator has a first node at which is produced a difference signal equal to the difference in magnitude between a continuous time analog signal and an analog feedback signal generated from a digital output signal; an integrator, coupled to the first node, to integrate the difference signal, thereby producing a first integrated signal; a photonic sampler, coupled to the integrator, to sample the first integrated signal, thereby producing a sampled integral signal; a quantizer, coupled to the sampler, to quantize the sampled integral signal, thereby producing the digital output signal; wherein an output of the quantizer is coupled to the first node through a digital to analog converter.

50 Claims, 7 Drawing Sheets

OTHER PUBLICATIONS

Korotky, S.K., et al., "Dual Parallel Modulation Schemes for Low–Distoration Analog Optical Transmission," *IEEE Journal on Selected Areas in Communications,* vol. 8, No. 7, pp. 1377–1381 (Sep. 1990).

Pace, P.E., et al., "Fiber Lattice Accumulator Design Considerations for Optical ΣΔ Digital Antennas," Naval Post-Graduate School, 10 pages total, Feb. 17, 1999.

Pace, P.E., et al., "Integrated Optical Sigma–Delta Modulators," *Opt. Eng.,* vol. 35, No. 7, pp.1828–1836 (Jul. 1996).

Pace, P.E., et al., "Photonic Sampling of RF and Microwave Signals," Naval PostGraduate School, Sections 9.3–9.4, pp. 35–56 (Mar. 16, 1998).

Bushshan, A.S. et al., "Time–Stretched Analogue–to–Digital Conversion, " *Electronics Letters,* vol. 34, No. 11, pp. 1081–1083 (May. 28, 1998).

Shoop, Barry L., et al., "High Resolution Optical A/D Conversion Using Oversampling and Interpolative Coding," *Signal, Systems, and Computers,* Twenty–Fifth IEEE Asilomar Conference, Los Alamitos, California, pp. 613–617 (1991).

Yariv, A., et al., "Time Interleaved Optical Sampling for Ultra–High Speed A/D Conversion, " *Electronics Letters,* vol. 34, No. 21. pp. 2012–2013 (Oct. 15, 1998).

Zhang, Yikui, et al., "Higher Order Delta–Sigma AD Converter with Optimized Stable Coefficients, " *IEICE Transactions On Fundamentals of Electronics,* vol. E84–A, No. 3, pp. 813–819 9Mar. 3, 2001).

* cited by examiner

OPTICALLY SAMPLED DELTA-SIGMA MODULATOR

CROSS REFERENCE TO RELATED APPLICATION

This application claims the benefit of U.S. Provisional Patent Application Ser. No. 60/332,369 filed on Nov. 15, 2001 for an "Optically Sampled Delta-Sigma Modulator" by Daniel Yap and, the disclosure of which is hereby incorporated by reference. U.S. Non-Provisional patent application Ser. No. 10/332,369 filed Nov. 15, 2001 corresponds to the aforementioned provisional application and is also related to this application.

This application is related to co-pending commonly filed U.S. patent Ser. No. 10/280,416 entitled "Time Interleaved Delta Sigma Analog to Digital Connector" filed simultaneously herewith and its corresponding U.S. Patent Application Provisional Ser. No. 60/332,373, filed on Nov. 15, 2001 the disclosure of which is hereby incorporated herein by reference.

FIELD OF THE INVENTION

This invention relates to optically sampled delta-sigma analog-to-digital converters and more specifically to an optically sampled delta-sigma modulator.

BACKGROUND OF THE INVENTION

It has been known for many years that delta-sigma modulation techniques can be used in analog-to-digital (A/D) converters. Only recently, however, have these techniques achieved widespread popularity. This popularity can be attributed to advances in VLSI technology that have allowed the realization of densely packed high speed circuits that are capable of effectively handling the bit stream associated with delta-sigma modulation.

A typical delta-sigma converter 100 is shown in FIG. 1A, and comprises a delta-sigma modulator 102 and a digital low-pass decimation filter 104. The delta-sigma modulator 102 comprises a summing node 111, an integrator 113 and a quantizer 115 coupled together in succession. A feedback loop 117 couples the output Y(i) of the delta-sigma modulator to the summing node 111 through a digital-to-analog (D/A) converter 112. In operation, an analog input signal that has been sampled X(i) enters the summing node 111 where an analog version of the feedback signal $Y_a(i)$ is subtracted from X(i) to create a difference signal $X_d(i)$. The difference signal $X_d(i)$ is then input to the integrator 113, which produces an integrated signal $X_I(i)$. The quantizer then rounds the integrated signal $X_I(i)$ to a closest possible level thereby producing a digital signal Y(i). The feedback loop 117 forces the average output of the modulator to be equal to the input signal X(i). The digital decimation filter 104 then processes the output stream of the delta-sigma modulator.

One byproduct of A/D conversion is quantization error. Quantization error occurs because the magnitude of the analog signals entering the quantizer can theoretically be equal to an infinite number of values, whereas the magnitude of the rounded signals leaving the quantizer can only be equal to a finite number of values. Therefore, the quantizer causes a rounding off, or quantization error.

The advantage of delta-sigma converters is their ability to reduce, relative to other types of converters, quantization error through the use of noise shaping and oversampling. Noise shaping is a filtering operation performed by the integrator 113 and feedback loop 117 that pushes the noise caused by the quantization error outside the bandwidth of interest. Oversampling performs the initial sampling operation at a rate much higher than twice the signal frequency. Then, when the quantized signal is processed by a lowpass decimation filter, much of the noise pushed to higher frequencies is removed by the filter.

Noise shaping will now be described with reference to the Z transform model of the delta-sigma modulator 102 shown in FIG. 1B. The integrator 113, often called the "feed forward loop filter," is a discrete time integrator having a transfer function of $Z^{-1}/(1-Z^{-1})$. Since the quantization noise is random, the quantizer 115 can be modeled as a noise source N(Z) coupled to a summing node 119. Moreover, the D/A converter 112 can be treated as ideal, and modeled as a unity gain transfer function for a single bit D/A converter. The output of the modulator is then given by:

$$Y(Z)=X(Z)Z^{-1}+N(Z)(1-Z^{-1})$$

Thus, the transfer function for the input signal, $H_x(Z)$, is equal to $Z^{-1}$, and the transfer function of the noise source, $H_n(Z)$, is equal to $(1-Z^{-1})$. Since zero frequency is represented in the Z transform at Z=1, it can readily be seen that, as the frequency approaches zero, N(Z) is attenuated. Therefore, the delta-sigma modulator acts as a high pass filter for quantization noise, and a low pass filter for the input signal.

The second way that delta sigma modulators reduce quantization noise is through oversampling. It is well known that to recover a sampled analog signal, the signal must be sampled at a rate greater than or equal to twice the signal frequency. Oversampling refers to sampling the signal at a rate much greater than twice the signal frequency. FIG. 2A shows the magnitude of quantization noise, in terms of the signal-to-noise ratio (SNR), at a particular frequency of interest f when the analog signal is sampled at the minimum sampling rate of $f_s$. FIG. 2B shows the magnitude of quantization noise at the same frequency of interest f when the signal is sampled at a sampling rate equal to $2f_s$. By comparing the quantization noise in FIGS. 2A and 2B, respectively, one can see that increasing the sampling frequency spreads the quantization noise over a larger bandwidth because the total amount of quantization noise remains the same over the different sampling bandwidths. Thus, increasing the sampling rate relative to twice the signal frequency, or oversampling, reduces the quantization noise in the bandwidth of interest.

One factor that limits the performance of analog-to-digital converters is temporal jitter in the sampling clock. Sampling clock jitter results in non-uniform sampling and increases the total error power in the quantizer output. If the clock jitter is assumed to contribute white noise, the total power of the error is reduced in a delta-sigma A/D converter by the oversampling ratio. Nevertheless, the clock jitter still can be a limiting factor for conversion of wideband signals.

One way to overcome sampling jitter limitations is through optical sampling. Optical sampling makes use of very short laser pulses with high temporal stability to sample an analog electrical input. Subpicosecond sampling, or aperture windows and sampling-pulse repetition rates above 40 GHz, can be achieved with optical sampling. The jitter of the optical sampling pulses can be less than 10 fsecs.

A conventional optically sampled A/D converter 200 is shown in FIG. 3. A series of optical impulses 201 from a mode-locked laser 203 are applied to an electro-optic modulator 205. The analog electrical input X(t) is also applied to the modulator 205. The optical impulses 201 sample the voltage associated with the analog electrical input X(t). The resultant optical pulses 207, with intensities determined by the modulator 205 voltage, are fed to a photodetector 209. The photodetector 209 electrical output 211 is supplied as the input of an electronic quantizer 212.

The above approach achieves very high sampling rates because the pulse repetition rate of the mode-locked laser can be 40 GHz or higher. Even higher repetition rates for the optical sampling pulses can be achieved by combining several time-delayed copies of each laser pulse.

A photonic sampler can be combined with a discrete-time delta-sigma modulator, as illustrated in FIG. 3, by replacing the electronic quantizer 212 with such a discrete-time modulator. Typical discrete-time delta-sigma modulators are implemented as switched-capacitor networks, since these circuits provide good control and flexibility in the realization of the noise-shaping and signal-transfer functions. The sampling rate of such switched-capacitor implementations, however, is limited to one-half or less of the unity gain bandwidth of its operational amplifiers. Also, such implementations typically are compatible only with CMOS transistor technologies.

For high sampling rates, continuous-time delta-sigma modulators are used. The sampling rates of such modulators can be greater than the unity gain bandwidth of its integrators. Also, such continuous-time modulators can be implemented in high speed transistor technologies such as heterojunction bipolar transistors formed in InP or GaAs materials. In a typical continuous-time delta-sigma modulator, the sampling occurs at the quantizer. A typical quantizer consists of an electronic latched comparator, which acts as a track and compare amplifier. In such an implementation, the sampling interval can depend on the input signal to the quantizer. The minimum sampling interval can be considered to be some portion of an edge of the clock waveform. The sampling interval, however, can become a large fraction of the clock period if the input level is approximately the same as the reference level. This results in additional uncertainty in the sampling. Thus, there is a need to incorporate an optical sampler into a continuous-time delta-sigma modulator.

An example of an optically sampled delta-sigma A/D converter, previously described by P. E. Pace and J. P. Powers of the U.S. Naval Postgraduate School, is illustrated in FIG. 4. This delta-sigma converter 300 contains a mode-locked fiber laser 302 to act as the source of sampling pulses, and two photonic samplers 304, which are Mach-Zehnder interferometric modulators. The fiber lattice structure 306 acts as an optical integrator. The photonic samplers 304 also serve as the analog summing point at the input of the delta-sigma loop.

Difficulties associated with the A/D converters shown in FIGS. 3 and 4 include high non-linearity and distortion spurs. Thus, the dynamic range of the photonic sampler limits prior A/D converters using photonic sampling techniques. For example, an analog waveform with a 5 GHz bandwidth can only be sampled to a resolution of 7.5 bits because the spur-free dynamic range of such samplers is approximately 110 dB-Hz$^{2/3}$. Therefore, what is needed is an A/D converter system that can utilize optical sampling without being adversely affected by the noise and distortion from the photonic sampler.

SUMMARY OF THE INVENTION

The present invention overcomes the difficulties associated with optical sampling by integrating the photonic sampler within the loop of a delta-sigma architecture by placing it after a continuous time integrator and before the electronic quantizer, thereby applying the noise shaping to spurs and noise which are produced by the photonic sampler. Moreover, since the dynamic range of the photonic sampler only needs to be as great as that of the quantizer, which typically can discern only one or a few bits, the photonic sampler can be a very nonlinear device such as an electroabsorption photodetector, which otherwise could not be used for sampling. Oversampling and noise shaping can therefore be employed to greatly increase the resolution of an A/D converter beyond the dynamic range of the photonic sampler or quantizer.

In one aspect the invention provides a delta-sigma modulator comprising: means for generating an analog feedback signal from a digital signal; means for producing a first difference signal, said first difference signal being equal to a difference in magnitude between a first analog signal and the analog feedback signal; means for integrating the first difference signal, thereby producing a first integrated signal; means for photonically sampling the first integrated signal, thereby producing a sampled integral signal; and means for quantizing the sampled integral signal, thereby producing the digital signal.

In one aspect the invention provides a method of performing delta sigma modulation comprising the steps of: producing a first difference signal equal to the difference in magnitude between a first analog signal and an analog feedback signal generated from a digital signal; integrating the first difference signal, thereby producing a first integrated signal; sampling the integral signal, thereby producing a sampled integral signal; quantizing the sampled integral, thereby producing the digital signal.

In another aspect the invention provides a delta-sigma modulator comprising: a first node which produces a difference signal equal to the difference in magnitude between a continuous time analog signal and an analog feedback signal generated from a digital output signal; an integrator, coupled to the first node, which integrates the difference signal and produces a first integrated signal; a sampler, coupled to the integrator, which samples the first integrated signal and produces a sampled integral signal; a quantizer, coupled to the sampler, which quantizes the sampled integral signal and produces the digital output signal; wherein an output of the quantizer is coupled to the first node through a digital to analog converter.

In another embodiment, multiple photonic samplers can be incorporated in parallel delta-sigma AND converter architecture, thereby achieving improvements in resolution with little or no oversampling.

In another embodiment, a delta sigma modulator comprising: a plurality of parallel connected circuits, each circuit being connected to receive a continuous time analog signal and comprising: a modulator for modulating the continuous time analog signal according to a coded sequence to produce a modulated analog signal; a first node to produce a difference signal equal to a difference in magnitude between the modulated analog signal and an analog feedback signal generated from a digital signal; an integrator, coupled with the first node, to integrate the difference signal, thereby producing a first integrated signal; at least one sampler, coupled with the integrator, to sample the first integrated signal, thereby producing a sampled integral signal; at least one quantizer, coupled with the sampler, to quantize the sampled integral signal, thereby producing the digital signal, an output of the quantizer being coupled to the first node through a digital to analog converter; and a digital demodulator for demodulating the digital signal; and wherein the digital signals produced by said parallel connected circuits are summed at a summing device.

In another embodiment, a delta sigma-modulator of Y order, where Y is an integer greater than or equal to one, said delta-sigma modulator comprising: a set of Y nodes, said set of Y nodes being divided into a first subset and a second subset when Y is greater than or equal to two, each node producing a difference signal equal to a difference between a first signal and a second signal, said first signal being equal to an analog input into said delta-sigma modulator when one node in said set of Y nodes is a first node, said second signal being equal to a feedback signal generated from a digital output signal for said first subset of Y node; a set of Y integrators, said set of Y integrators being coupled with said set of Y nodes, each integrator integrating the difference signal from a preceding node in said set of Y nodes, said integrated signal being directed toward a proceeding node from said set of Y nodes until said integrated signal is generated from a last integrator from said set of Y integrators, said last integrator producing a last integrated signal; a set of K summer devices, where K is an integer greater than or equal to Y/2, K being equal to zero when Y is equal to 1, each one of said set of K summers being connected with said nodes in said second subset of Y nodes, each of said summers combining a feedback signal generated from said digital output signal with the integrated signal from one of said set of Y integrators; a photonic sampler, for photonically sampling said last integrated signal and producing a sampled integrated signal; a quantizer, which quantizes the sampled integrated signal and produces the digital output signal; and a set of Y digital to analog converters, each digital to analog converter for converting said digital output signal into said feedback signal, a first subset of Y digital to analog converters providing said feedback signals to said first subset of Y nodes, a second subset of Y digital to analog converters providing said feedback signals to said set of K summers.

In another embodiment, a method for improving a delta-sigma modulator comprising the steps: integrating an analog input signal producing an integrated analog input signal; and optically sampling said integrated analog input signal to produce an optically sampled integrated signal.

DETAILED DESCRIPTION OF THE PREFERRED EMBODIMENTS

Figure 1A:
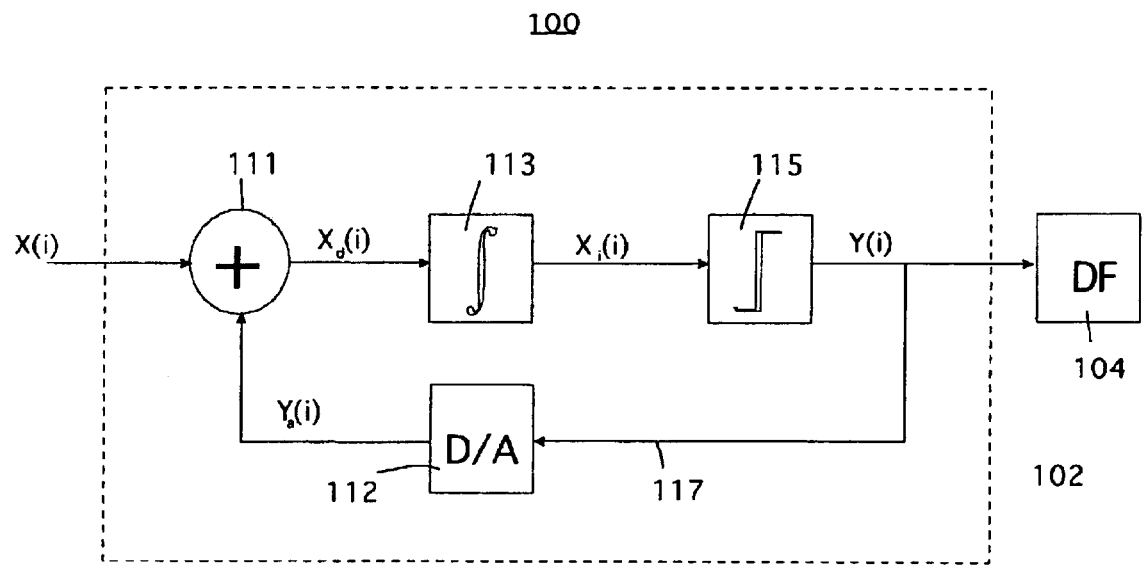
FIG. 1A depicts a conventional delta-sigma converter.
Figure 1B:
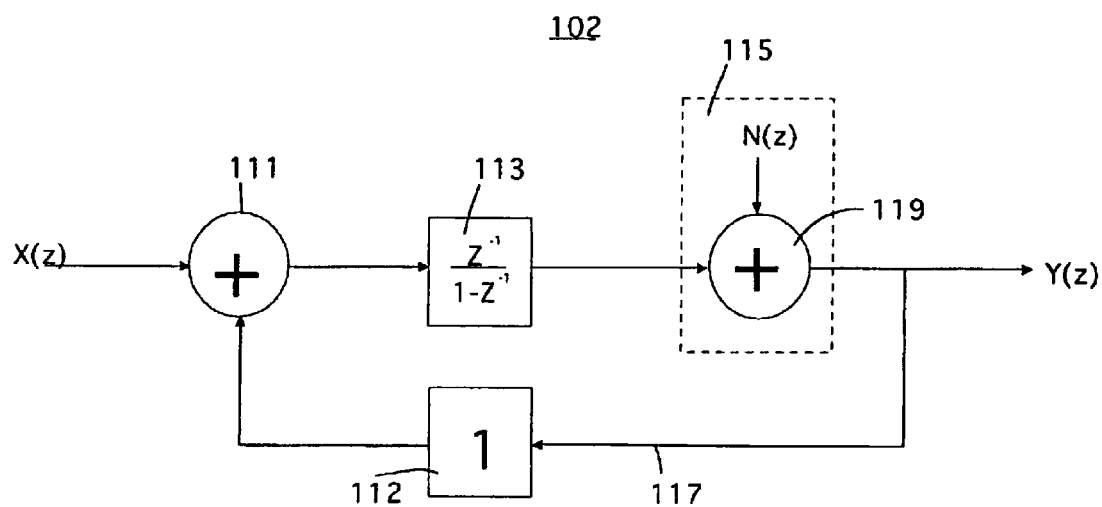
FIG. 1B is a Z transform model of the delta-sigma modulator depicted in FIG. 1A.
Figure 2A:
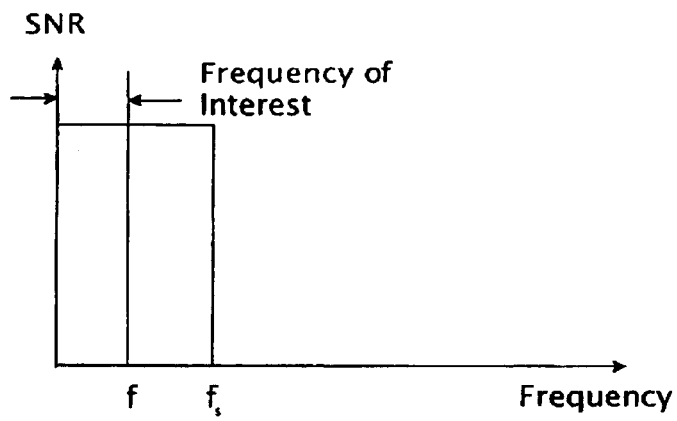
FIG. 2A (prior art) depicts the magnitude of quantization noise, in terms of the signal-to-noise ratio (SNR), at a particular frequency of interest f, when the analog signal is sampled at the minimum sampling rate of $f_s$.
Figure 2B:
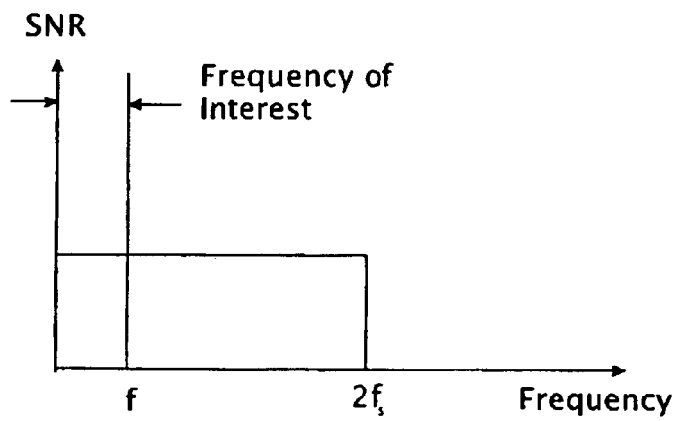
FIG. 2B (prior art) depicts the magnitude of quantization noise at the same frequency of interest f when the signal is sampled at a sampling rate equal to $2f_s$.
Figure 3:
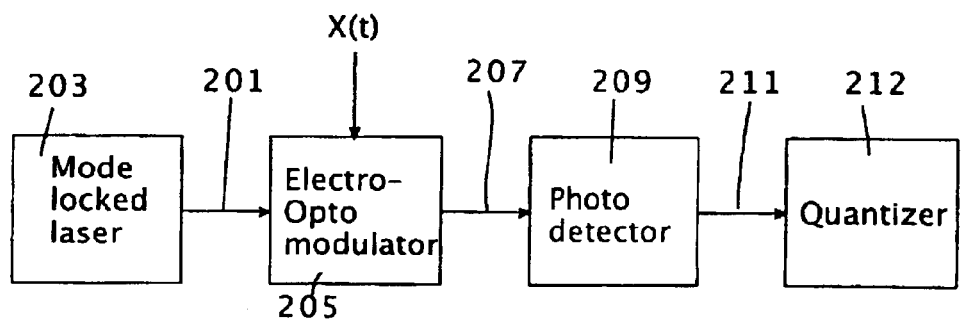
FIG. 3 shows a conventional optically sampled A/D converter.
Figure 4:
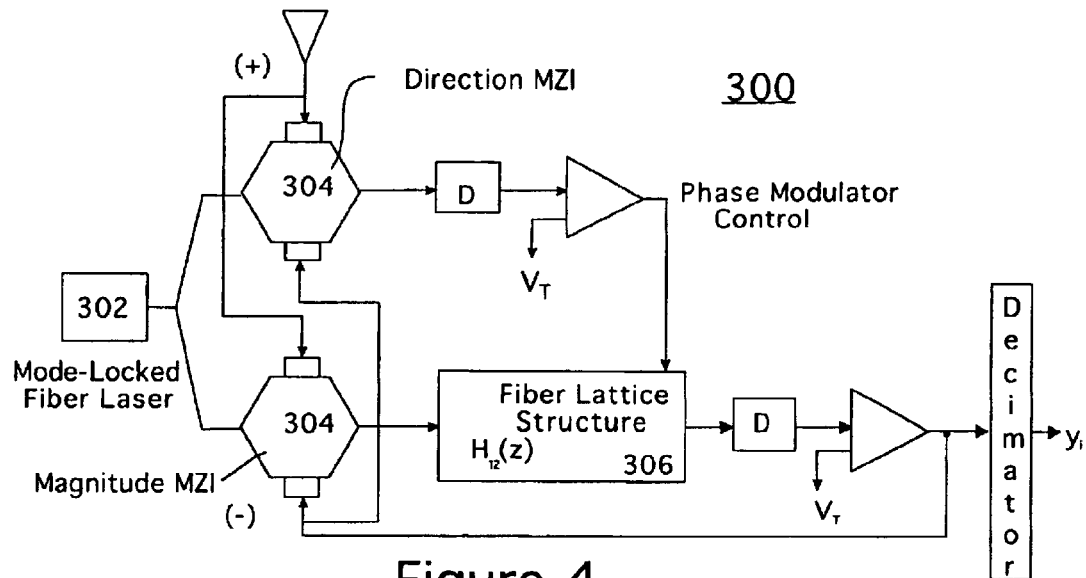
FIG. 4 depicts a conventional optically sampled delta-sigma A/D converter.
Figure 5:
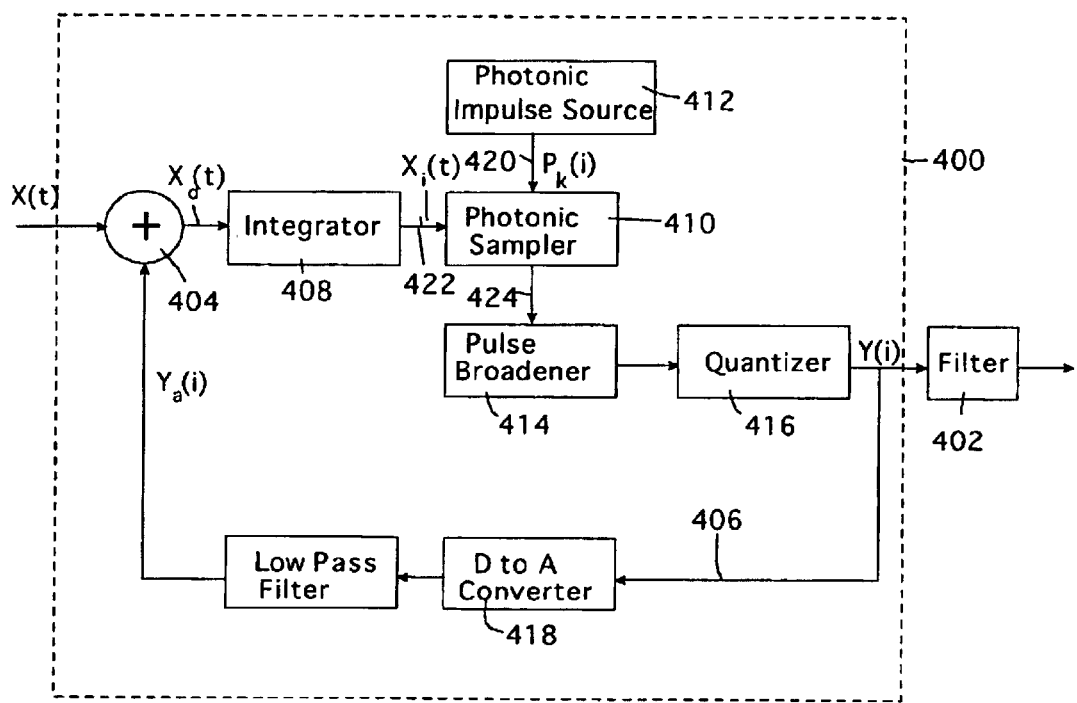
FIG. 5 illustrates one embodiment of a delta-sigma A/D converter in accordance with the present invention.

FIG. 5 illustrates one embodiment of a delta-sigma A/D converter in accordance with the present invention. The A/D converter comprises a delta-sigma modulator loop 400 and a subsequent digital decimation filter 402. In the converter shown in FIG. 5, however, a continuous time analog input signal X(t) is applied to the input summing node 404 of the delta-sigma modulator loop 400. At the input node 404, the feedback path 406 causes, after D/A conversion, an analog representation of the quantized output to be subtracted from the analog input signal X(t) to produce a difference signal $X_d(t)$. The difference signal is then integrated by an integrator 408, which is also called a "feedforward loop filter", to produce a integral signal $X_i(t)$. The integrated signal $X_i(t)$ is then sampled by a photonic sampler 410 that receives optical pulses from a photonic impulse source 412, such as a mode locked fiber laser. The photonic sampler 410 produces short electrical pulses with amplitudes determined by the output level (or voltage) of the integrator 408. A pulse broadener 414, such as a filter or integrator, can broaden these short pulses, if desired. The quantizer 416 then compares the peak value of the pulses with a predetermined threshold value and outputs a digital "one" or a "zero" according to the comparison. The digital output stream Y(i) emanating from the quantizer 416 is then processed by the digital decimation filter 402. The digital output stream Y(i) is also directed to feedback path 406 in which it is converted to an analog signal $Y_a(i)$ by D/A converter 418, possibly low-pass filtered, and eventually subtracted from a later portion of the analog input signal X(t).

In a delta-sigma modulator, the noise shaping applies to any noise or spur content that is added by elements of the A/D converter that are located between the integrator output and the feedback node. As was heretofore mentioned, the delta-sigma modulator 400 shapes the noise spectrum by decreasing the noise power within the signal band and increasing the noise power outside the signal band. The noise power could be due to quantization noise, other noise sources in the comparator, sources of noise or spurs in the sampler 410, or noise sources in the photonic impulse source 412. The degree of the noise shaping depends on the order of the delta-sigma modulator loop. The operation of a first order modulator has been described. Delta-sigma modulators of higher order can also be achieved with this invention, by the construction of higher order continuous time integrators, in a known fashion, before the photonic sampler 410. In addition, a delta-sigma modulator with a 1-bit quantizer has been described, but quantizers with higher output resolution can also be used.

The photonic sampler 410 is an element that accepts, at a first input 420, a sequence of optical pulses $P_k(i)$ and, at a second input 422, the analog electrical waveform $X_i(t)$. At the output 424 of the sampler a sequence of electrical pulses is generated having amplitudes determined by the values of the analog waveform $X_i(t)$ applied at second input 422 at the instances that the waveform concurs with the optical pulses at first input 420. The output of this sampler preferably has at least as many distinguishable levels as needed for the quantizer. However, in many cases, only two distinct output levels are needed.

Figure 6A:
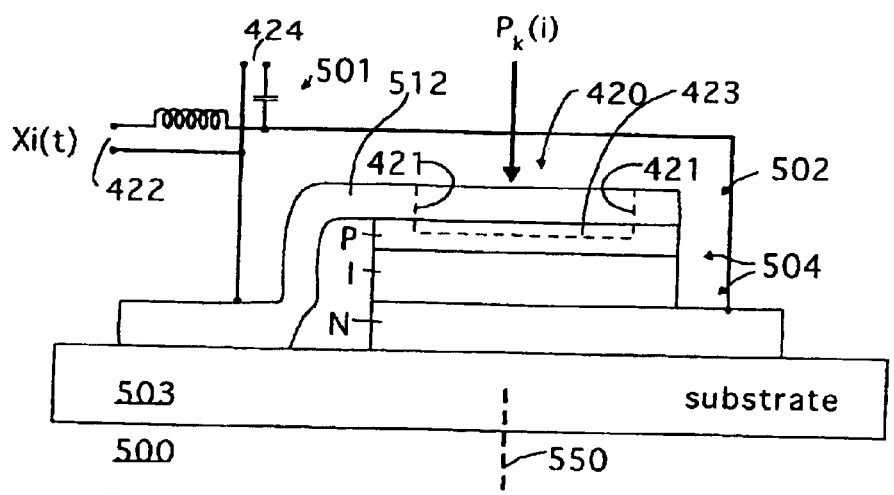
FIG. 6A is a side elevation view of one type of a photonic sampler that could be used with the present invention.

One type of photonic sampler 410 that can be used with the present invention is illustrated by the surface normal sampler 500 shown in FIG. 6A. The sampler of FIG. 6A has an generally circular shape with an annular opening 420 therein when viewed from the top. In FIG. 6A the sampler is shown in a side elevation view, the annular opening 420 being defined by interior walls 421 and a bottom surface 423. As can be seen, the annular opening 420 has a bottom surface 423 in the P layer of a PIN diode structure 504. The photonic sampler 500 can have, if desired, an optical output 550. In the embodiment of FIG. 6A the optical output 550 could be applied to a waveguide beneath or in substrate 503, for example. In the embodiments described herein the output 550 is not utilized, and for that reason the arrow(s). representing the optical output is shown in phantom lines.

Sampler 500 includes a voltage controlled photodetector 502. The optical sample pulse $P_k(i)$ enters the annular opening 420 and thus opening 420 serves as the optical input. The analog waveform $X_i(t)$ supplies the control voltage to input 422. The output occurs at 424. A PIN diode structure is preferred device for the voltage controlled photodetector 502. Alternatively, a current controlled photodetector could be used. Various effects that can result in a voltage controlled absorption (electro-absorption) of light include the Franz-Keldysh effect and the quantum-confined Stark effect. Both of these effects produce a shift in wavelength of the absorption spectrum according to the reverse biased voltage across the junction of the diode structure 504 formed by the N-type layer N, intrinsic layer I and P-type layer P. As the reverse biased voltage is increased, the absorption is increased correspondingly. The absorbed light of the optical input pulses input at first input 420 is converted to electrical charge carriers to produce the output electrical pulses Y(i) at output 424. In general, this absorption versus voltage dependency is highly nonlinear. However, such non-linearity can be tolerated as only a few output levels usually need be distinguished. The electrical input to the photodetector contains a frequency selective circuit 501, which separates lower frequency and higher frequency components into two different ports 422 and 424. The lower frequency port 422 is used to apply a DC bias voltage or set point for the voltage controlled photodetector as well as analog input waveform $X_i(t)$. The higher frequency port 424 is used as the output for the short sampled pulses. Note that the rate of the optical sampling pulses is typically at least twice as high as the frequency content of the analog input and could be much higher for A/D converter systems with substantial oversampling. An advantage of this sampler is that it contributes a minimal delay to the feedback loop.

However, if it is desirable for the sampler 410 to be sensitive to voltage levels of a fraction of a volt, using an alternative construction in which the optical sampling pulse interacts with the analog waveform for a longer duration can increase the sensitivity of the sampler. The extended interaction can be achieved by means of the waveguide structure 600 shown in FIG. 6B. If the analog signal is expected to have a very high frequency (for example, 10 GHz), then a multi-segment traveling wave structure shown in FIG. 6C can be utilized. In the waveguide structure 600, the analog input signal, which for the present invention is the integral signal $X_i(t)$, travels in a microwave transmission line 602 and optical pulses $P_k(i)$ travel in a continuous optical waveguide 604 that contains a voltage controlled absorbing material 606.

Figure 6B:
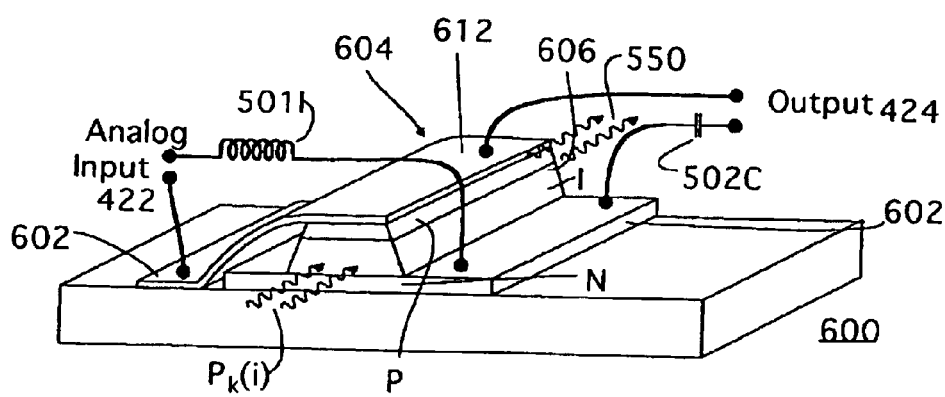
FIG. 6B is a perspective view of a wave guide structure.
Figure 6C:
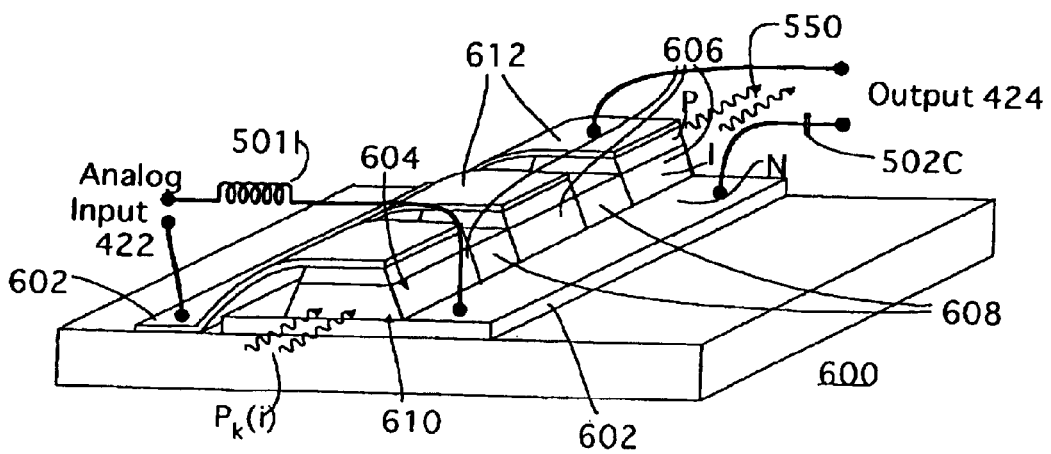
FIG. 6C is a perspective view of a multi-segment traveling wave structure.

In the multi-segment traveling wave structure of FIG. 6C, the optical waveguide 604 is broken up into segments of absorbing material 606 and segments of nonabsorbing material 608. The absorbing material 606 has a band gap wavelength that is slightly shorter that the wavelength of the optical sampling pulses $P_k(i)$. Non-absorbing material 608 has an even larger band gap than does the absorbing material. For example, if the wavelength of the optical pulses $P_k(i)$ is 1550 nm, potential absorbing and non-absorbing materials include GaInAsP, GaInAlAs and GaInAs/AlInAs multiple quantum wells. The ratios of the constituent elements is varied to render the material absorbing or non-absorbing for the frequencies of interest. In the structures of FIG. 6C, the integrated analog signal $X_i(t)$ travels along with an optical sampling pulse $P_k(i)$ and modulates the voltage, across the absorbing region(s) 606, seen at a given time by the optical pulse. Typically, the propagation velocity of the analog microwave signal is matched to the velocity of propagation of the optical pulses $P_k(i)$ in the sampler. The intensity of an optical pulse $P_k(i)$ diminishes gradually as that pulse and the corresponding portion of the integral signal $X_i(t)$ propagate together in the structure. The degree of attenuation of the pulse $P_k(i)$ is determined by the voltage level of one particular point of the integral signal $X_i(t)$, since that point continues to set the amount of electro-absorption experienced by the pulse.

As the optical pulse is absorbed, a photocurrent I is generated which likewise travels along the structures shown by FIGS. 6B and 6C. A termination resistor, or some other electronic means, such as the quantizer, can measure the photocurrent I at the output end of these structures. Note that a reverse photocurrent is also generated which travels along the microwave transmission line 602 in the opposite direction and can be kept from interfering with the forward traveling photocurrent by placing a resistive termination (not shown) at the front end of the transmission line. The bias tee circuit 501 of FIG. 6A would also typically be used with the structures shown by FIGS. 6B and 6C, and the inductor 501I and capacitor 502C thereof are shown in FIGS. 6B and 6C. The devices of FIGS. 6B and 6C may also have an optical output 550.

The samplers of FIGS. 6A, 6B and 6C all have a metal contact 512, 612 at the top surface of the PIN diode structures. The metal is preferably TiPtAu, TiAu, AuZn, AuBe or AuGe depending on the conductivity types of the semiconducting materials making up the diode structures. Materials which may be used to form the I or intrinsic layer have already been discussed. The P layer may be formed by InP, InAlAs, GaInAsP or GaInAlAs while the N layer may be formed by InP or GaInAsP. It is to be noted that the materials identified for the various layer of the PIN diode structures and for the metal contact are exemplary and other materials may be substituted therefor.

The specific designs of a waveguide photodetector (see FIG. 6B) or multi-segment voltage controlled photodetector (see FIG. 6C) are similar to that of similar photodetectors which do not have the feature of voltage controlled absorption or electro-absorption. For both of these photodetector structures, the microwave signals at the output of the transmission line 602 contain a combination of the energy from the analog input signal X(t) and the energy from the photocurrent I. Some means to distinguish between these components is typically used. For example, the analog input and the sampled photocurrent can have energy in different frequency bands because the sampling pulse is so short and substantial oversampling is used. Thus, these two signals can be separated by using conventional microwave frequency selective filtering elements (not shown).

Figure 6D:
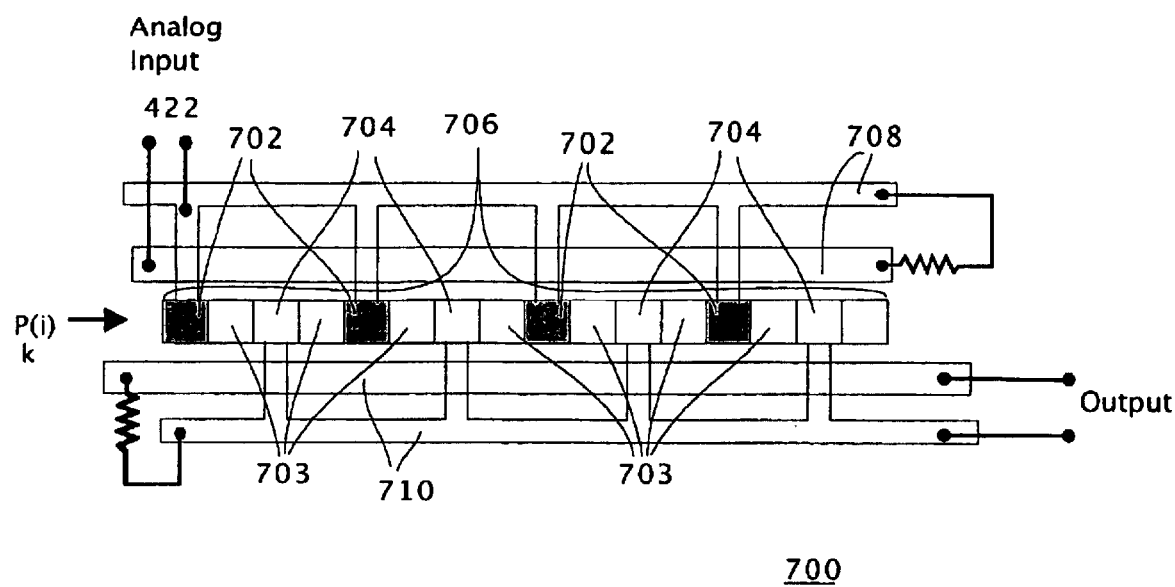
FIG. 6D depicts a sampler realized by interleaving a series of electro-absorbing segments.

Still another embodiment of sampler 410 is shown at numeral 700 in FIG. 6D in plan view. This embodiment is realized by interleaving a series of electro-absorbing segments 702 and a second series of photodetecting segments 704 that have fixed absorbancy. Between each of these segments 702, 704 are preferably disposed non-absorbing segments 703. The fixed-absorbance segments 704 can be a series of electro-absorbing segments with a constant voltage applied thereto that is much higher than the full scale voltage of the analog signal X(t) at input 422. The electro-absorbing segments 702 function as voltage controlled optical attenuators. They may be formed of the same materials as (or different materials than) are the fixed absorbance segments 704, but the fixed absorbance segments 704 see a higher fixed voltage while the electro-absorbing segments 702 see the lower analog input signal X(t). For a 1550 nm wavelength optical signal $P_k(i)$, the preferred material is GaInAs for an intrinsic layer of fixed adsorbents. The photodetecting segments 704 sense the amount of optical attenuation that occurred in the preceding segment. The sampler 700 has an optical waveguide 706 formed by segments 702, 703 and 704, an input microwave transmission line 708 and an output microwave transmission line 710. The optical sampling pulses $P_k(i)$ travel in the optical waveguide 706. The analog input, or, once again, the integral signal $X_i(t)$ waveform travels in the input microwave transmission line 708 and the sensed photocurrent travels in the output transmission line 710. That output photocurrent I again provides an indication of the sampled analog signal. However, in this sampler, the photocurrent I is inversely proportional to the analog input. For an integral signal $X_i(t)$ of higher voltage, more of the optical sampling pulse $P_k(i)$ energy is absorbed in the electro-absorbing segments 702 and therefore less of the energy is available for absorption in the photodetecting segments 704. An advantage of this approach of this sampler is that the analog input signal is kept separate from the photodetected sampled signal. The comparator, which would be located at the end of the output transmission line, thus could be much simpler.

The sampler of FIG. 6D, if viewed in a perspective view, would appear much like the sampler of FIG. 6C, except that instead of having all the metal layers 612 connected on the left hand side of the device, every other metal layer 612 would be connected on the right hand side of the device to the output line 424 and would thus be associated with a fixed absorbance segment 704.

The various embodiments of photonic samplers described above can be fabricated using conventional processing approaches. These approaches are presently employed to fabricate photodetectors whose sensitivities, unlike the samplers, are generally not varied by a voltage or current control. The third sampler embodiment of FIG. 6C, which contains both electro-absorbing and nonabsorbing segments, can be fabricated using known methods for integrating active and passive waveguide devices, such as multistep material growth or selective-area material growth.

In the embodiments of FIGS. 6A, 6B and 6C, as the applied voltage at input 422 goes up, the output current also goes up. This is due to the fact that the generated current is based on photoabsorption of the light. In the embodiment of FIG. 6D, as the applied voltage at input 422 goes up, the output current goes down. This is due to the fact that the generated current is based on light which is not photoabsorbed. Those skilled in the art will thus appreciate the fact that a different circuit design will used for the embodiment of FIG. 6D compared with the embodiments of FIGS. 6A–6C to account for this difference.

The various photonic samplers described above have sampling aperture (temporal) widths that are determined by the width of the optical sampling pulses. These pulses can have widths of a fraction of a picosecond. Moreover, the width of the photodetector output pulses may be somewhat greater than the width of the optical input pulses because of capacitance in the photodetector structure or other effects. These pulses can be intentionally made even wider still by passing them through analog filters. Having a wider pulse relaxes the timing requirement on the clock of the subsequent comparator/quantizer. With optical sampling, the regeneration time of the comparator and the level of the analog input signal do not determine the sampling width. The regeneration time does, however, constrain the maximum clock speed, and thus the maximum sampling rate. Note that the comparator regeneration time is inversely proportional to the $f_t$ of the transistors used in the comparator circuit. Even when a fast transistor technology is used, a comparator limited sampling rate would be only slightly higher than 10 giga samples per second (GSPS).

The photonic sampler produces a voltage that can be evaluated by the comparator/quantizer. The gain of the photonic sampler may have some frequency dependence. The photonic sampler also tends to add some noise and distortion products to the voltage that it supplies to the comparator. These likewise may have some dependence on the frequency of the analog input. Besides producing the voltage signal for the comparator, the sampler also adds some delay to the delta-sigma loop. This delay should be considered to ensure that stability is maintained.

Figure 7:
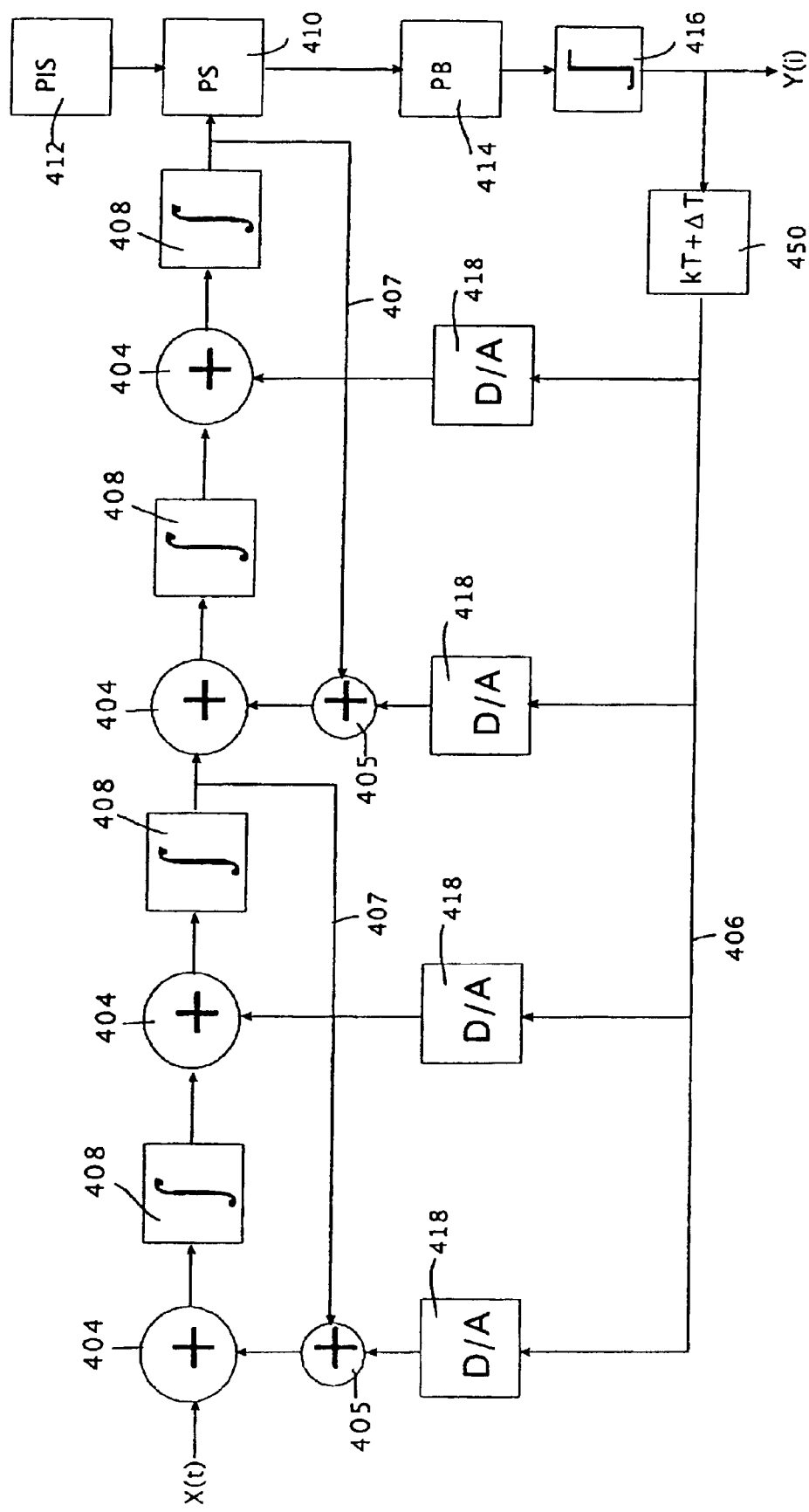
FIG. 7 is a block diagram of a continuous-time delta-sigma modulator loop with 4th order filtering.

The block diagram shown in FIG. 7 represents a continuous-time delta-sigma modulator loop with $4^{th}$ order filtering. In this figure, T denotes the sampling period, $\Delta$ is an non-integer delay with a value $0<\Delta<1$, and k is a non-negative integer. This $4^{th}$ order filter is exemplary and those skilled in the art will appreciate that other orders of filter can be used. The temporal delay attributed to the photonic sampler can be included in this model of the delay. It is assumed here that all functions are instantaneous and all delays are represented by the single block at numeral 450. An analysis based on this construct can be done to evaluate the effects of the photonic sampler. Furthermore, it can provide guidelines to be used in selecting among the different approaches given above for a photonic sampler. For example, a sampler that involves a long transmission line would produce a long delay but be sensitive to smaller voltages. A specific analysis would depend on the performance requirements of the A/D converter, such as the desired sampling rate and resolution.

The modulator loop of FIG. 7 includes components similar to those previously discussed with reference to FIG. 5 and therefore the same reference numerals are used to refer to the same or similar elements. However, instead of one integrator 408, this embodiment has four integrators 408. Likewise it has four summing nodes 404 and four D/A convertors 418. Each pair of two integrators 408 and two summing nodes 404 has its own feedback path 407 which feeds back to an additional summing node 405. A photonic sampler is shown at reference number 410. An optional pulse broadener is at block 414. Block 416 is a quantizer while block 412 is a photonic impulse source such as a mode locked fiber laser.

Figure 8:
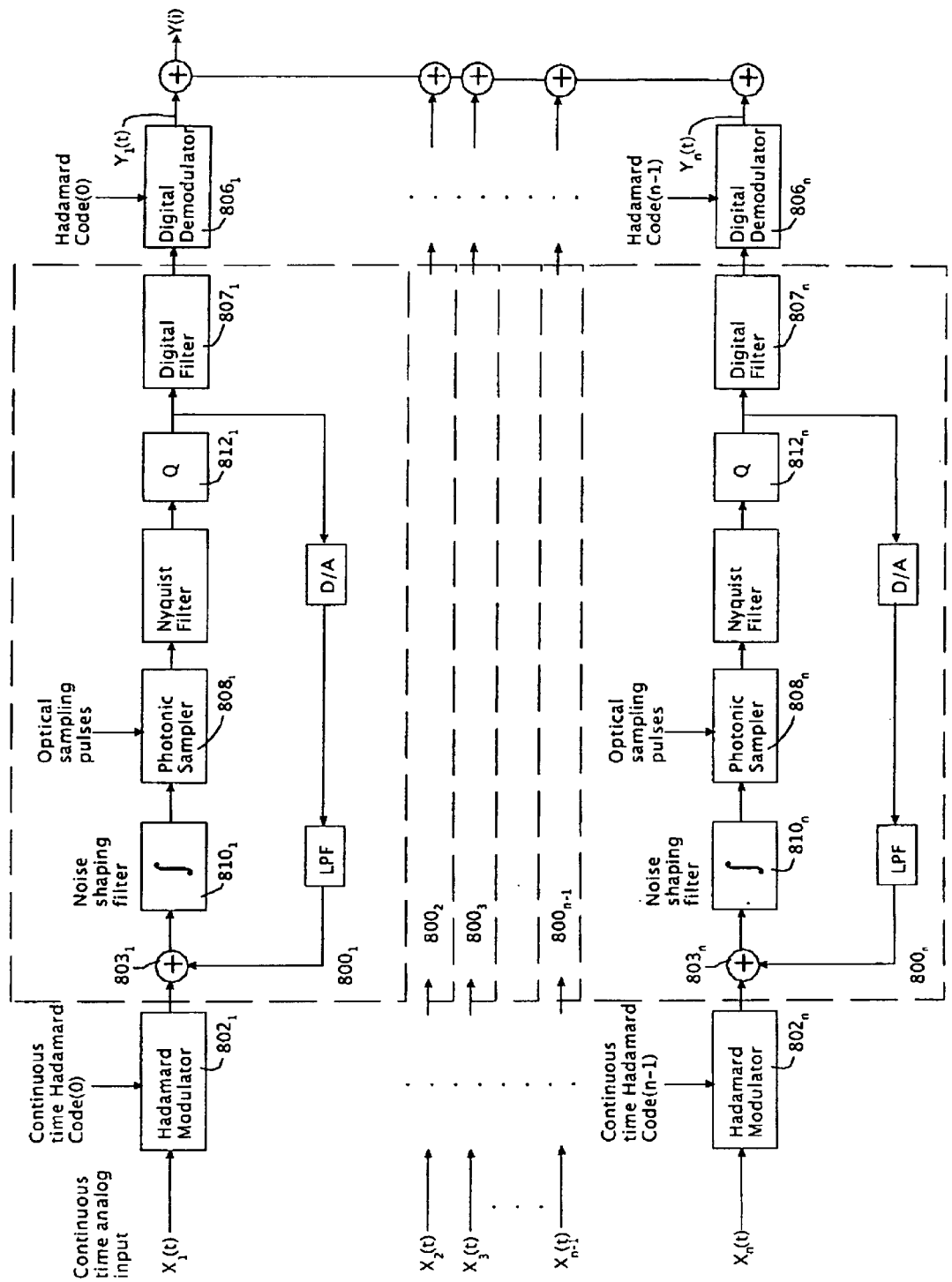
FIG. 8 is a block diagram of a parallel delta-sigma A/D converter with optical sampling.

A parallel delta-sigma A/D converter with optical sampling is shown in FIG. 8. According to this embodiment, the analog input X(t) signal is divided among n multiple parallel delta-sigma modulator circuits $800_n$. The subscript n in FIG. 8 and in the following description refer to the fact that there are n parallel paths and thus n loops 800 identified as circuits 800$_1$ through 800$_n$. This device is a parallel arrangement of first order filters. The 4$^{th}$ order filter of FIG. 7 (or a different order filter or a different 4$^{th}$ order filter) could be used for each parallel filter circuit 800$_n$ of FIG. 8. Of course many other arrangements are possible and the arrangements shown by the figures, and particularly FIGS. 5, 6A, 6B, 6C, 6D, 7 and 8, should be considered to be merely exemplary of the possibilities.

In FIG. 8, the continuous-time inputs $X_1(t)$ through $X_n(t)$ to each associated parallel circuit 800$_n$ is first preferably coded with a Hadamard sequence of +1 or −1 values by Hadamard coders 802$_1$–802$_n$. In the following description the subscripts are sometimes omitted, although they are used in FIG. 8 to identify to which loop the elements belong. The Hadamard coded input in each loop is then supplied to the summing junction 803 of each loop 800$_n$. The digital output stream from each the quantizers 812 in each loop 800$_n$ is first filtered by digital decimation filters 807 then decoded with the Hadamard sequence associated with that parallel circuit 800$_n$ by digital demodulators 806 to produce an output $Y_n(t)$. The outputs $Y_1(t)$ through $Y_n(t)$ are summed digitally to produce the output $Y(i)$.

An advantage of using Hadamard coders/decoders is that they are relatively simple, yet effective devices. Other coder/decoder combinations can certainly be used instead. Each parallel circuit 800$_n$ has a different Haramard code. Each parallel circuit 800$_n$ also has a feedback path with a digital to analog convertor D/A and optionally a low pass filter LPF coupling the output of the quantizer 812 to the summing node 803 in each circuit 800$_n$.

Optical sampling is incorporated into the parallel delta-sigma architecture of FIG. 8 in the same way as it is incorporated into a single-channel delta-sigma architecture such as that shown by the embodiment of FIGS. 5 or 7. In the parallel channel embodiment of FIG. 8 a photonic sampler 808 is placed within each of the circuits 800 between the integrator 810 and the quantizer 812. Thus, the noise-spectrum shaping and filtering performed by the parallel delta-sigma approach is applied to the noise and spurs created by each photonic sampler and photonic impulse source. One implementation of this approach would be to have a single laser generate the optical pulses supplied to the photonic sampler 808 in each circuit 800$_n$ by dividing the energy of each optical pulse among the multiple parallel samplers 808. With this approach, it is desirable to divide the energy evenly, otherwise, if an unequal energy division is not compensated for, the performance of the parallel delta-sigma A/D converter will degrade. Similarly, it is desirable to try to match the characteristics of the multiple photonic samplers 808. The photonic sampler 808 of each loop 800$_n$ may be provided by one of the structures shown in FIGS. 6A, 6B, 6C or 6D, for example. One way of compensating for an non-uniform, but fixed, division of the sampling pulse energy would be by selecting different gains for the digital filters 807.

A net sampling rate that is higher than the clock rate can be obtained by time-interleaving the sampled pulses among several parallel comparators and D/A converters located within a delta-sigma loop. An embodiment of such a delta sigma modulator is shown and described in U.S. patent application Ser. No. 10/280,416 filed on the same day as the present application, entitled "Time-Interleaved Delta Sigma Analog to Digital Converter."

From the foregoing description, it will be apparent that the present invention can be implemented in a number of different ways. Furthermore, the invention has a number of advantages, some of which have been described above, and others of which are inherent in the embodiments of the invention described above. Also, it will be understood that modifications can be made to optically sampled delta-sigma converter and method for performing delta-sigma modulation described above without departing from the teachings of subject matter described herein. As such, the invention is not to be limited to the disclosed embodiments expect as required by the appended claims.

What is claimed is:

1. A delta-sigma modulator comprising:
    means for generating an analog feedback signal from a digital signal;
    means for producing a first difference signal, said first difference signal being equal to a difference in magnitude between a first analog signal and the analog feedback signal;
    means for integrating the first difference signal, thereby producing a first integrated signal;
    means for photonically sampling the first integrated signal, thereby producing a sampled integral signal; and
    means for quantizing the sampled integral signal, thereby producing the digital signal.

2. The delta-sigma modulator of claim 1 wherein the photonic sampling
    means comprises:
        means for producing a photonic impulse;
        means for detecting the photonic impulse; and
        means for outputting an electrical pulse with an amplitude determined by the first integrated signal at an instance that the first integrated signal concurs with the photonic impulse.

3. The delta-sigma modulator of claim 2 further comprising means for broadening pulses of the sampled integral signal.

4. The delta-sigma modulator of claim 3 wherein the means for outputting an electrical pulse includes means for varying the optical absorption of a material according to the first integrated signal.

5. The delta-sigma modulator of claim 1 wherein the means for generating an analog feedback signal comprises a digital-to-analog converter.

6. The delta-sigma modulator of claim 1 further comprising:
    means for producing a second difference signal equal to a difference in magnitude between a second analog signal and a sum of the first integrated signal and the analog feedback signal; and
    means for integrating the second difference signal thereby producing a second integrated signal, wherein said first analog signal is said second integrated signal.

7. The delta-sigma modulator of claim 6 further comprising:
    means for producing a third difference signal equal to a difference in magnitude between a third analog signal and the analog feedback signal; and
    means for integrating the third difference signal thereby producing a third integrated signal, wherein said second analog signal is said third integrated signal.

8. The delta-sigma modulator of claim 7 further comprising:
    means for producing a fourth difference signal equal to a difference in magnitude between a fourth analog signal and a sum of the third integrated signal and the analog feedback signal generated from the digital signal; and means for integrating the fourth difference signal thereby producing a fourth integrated signal, wherein said third analog signal is said fourth integrated signal.

9. The delta-sigma modulator of claim 8 wherein the sampling means samples the first, second, third or fourth integrated signals at a rate greater than or equal to 10 giga samples per second (GSPS).

10. The delta-sigma modulator of claim 1 wherein the first analog signal is a coded analog signal.

11. The delta-sigma modulator of claim 10 wherein the coded analog signal is coded according to a Hadamard code.

12. The delta-sigma modulator of claim 11 further including a digital demodulator responsive the Hadamard code, the digital demodulator having an input for receiving said digital signal and an output for providing a demodulated digital signal thereat.

13. The delta-sigma modulator of claim 1 further including a digital demodulator, the digital demodulator having an input for receiving said digital signal and an output for providing a demodulated digital signal thereat.

14. The delta-sigma demodulator of claim 13 including a plurality of parallel connected circuits, each of said parallel connected circuits comprising: said means for generating, means for producing, means for integrating, means for sampling, means for quantizing and said digital demodulator.

15. A method of performing delta sigma modulation comprising the steps of:
producing a first difference signal equal to the difference in magnitude between a first analog signal and an analog feedback signal generated from a digital signal;
integrating the first difference signal, thereby producing a first integrated signal;
photonically sampling the first integrated signal, thereby producing a sampled integral signal; and
quantizing the sampled integral signal, thereby producing the digital signal.

16. The method of claim 15, wherein the first integrated signal is sampled at a rate greater than 10 GSPS.

17. The method of claim 15, wherein the photonic sampling step comprises the steps of:
producing a photonic impulse;
detecting the photonic impulse; and
outputting an electrical pulse with amplitude determined by the value of the first integrated signal at an instance that the first integrated signal concurs with the photonic impulse.

18. The method of claim 17 further comprising the step of broadening the electrical pulse.

19. The method of claim 15 further comprising the steps of:
producing a second difference signal equal to a difference in magnitude between a second analog signal and a sum of the first integrated signal and the analog feedback signal; and
integrating the second difference signal thereby producing a second integrated signal, wherein said first analog signal is said second integrated signal.

20. The method of claim 19 further comprising the steps of:
producing a third difference signal equal to a difference in magnitude between a third analog signal and the analog feedback signal generated from the digital signal; and
integrating the third difference signal thereby producing a third integrated signal, wherein said second analog signal is said third integrated signal.

21. The method of claim 20 further comprising the steps of:

producing a fourth difference signal equal to a difference in magnitude between a fourth analog signal and a sum of the third integrated signal and the analog feedback signal; and
integrating the fourth difference signal, thereby producing a fourth integrated signal, wherein said third analog signal is said fourth integrated signal.

22. The method of claim 21, wherein the first, second, third and fourth integrated signals are sampled at a rate greater than 10 GSPS.

23. The method of claim 21, wherein the second, third and fourth integrated signals are photonically sampled.

24. The method of claim 23, wherein the photonic sampling step comprises the steps of:
producing a photonic impulse;
detecting the photonic impulse; and
outputting an electrical pulse with an amplitude determined by the value of the first integrated signal at an instance that the first integrated signal concurs with the photonic impulse.

25. The method of claim 24 further comprising the step of broadening the electrical pulse.

26. The method of claim 15 wherein the first analog signal is modulated according to a predetermined coded sequence.

27. The method of claim 26 wherein the predetermined coded sequence is a Hadamard code sequence.

28. The method of claim 27 wherein the digital signal is decoded by a digital demodulator responsive to the Hadamard code sequence used to modulate the first analog signal.

29. The method of claim 15 wherein the first analog signal is modulated by a plurality of different code sequences to produce a plurality of modulated analog signals which are further processed to generate a plurality of digital signals, the plurality of digital signals being digitally demodulated and summed.

30. A delta-sigma modulator comprising:
a first node which produces a difference signal equal to a difference in magnitude between a continuous time analog signal and a feedback signal generated from a digital output signal;
an integrator, coupled with the first node, which integrates the difference signal and produces a first integrated signal;
a photonic sampler, coupled with the integrator, which photonically samples the first integrated signal and produces a sampled integral signal; and
a quantizer, coupled with the sampler, which quantizes the sampled integral signal and produces the digital output signal,
wherein an output of the quantizer is coupled with the first node through a digital to analog converter.

31. The delta-sigma modulator of claim 30 wherein the photonic sampler samples the first integrated signal at a rate greater than 10 GSPS.

32. The delta-sigma modulator of claim 30 wherein the photonic sampler comprises a voltage controlled photodetector having an optically sensitive surface for receiving an optical sample pulse from a photonic impulse source and having an analog input for receiving the first integrated signal from the integrator.

33. The delta-sigma modulator of claim 30 wherein the photonic sampler comprises a PIN diode with P, I and N layers, the PIN diode having an optically sensitive surface associated with the I layer for receiving an optical sample pulse from a photonic impulse source and wherein P and N layers of the PIN diode are connected to receive the first integrated signal from the integrator.

34. The delta-sigma modulator of claim 33 wherein the photonic sampler has an output connected to the P and N layers of the PIN diode.

35. The delta-sigma modulator of claim 33 wherein an output of the photonic sampler and an input to the PIN diode are separated by a frequency selective divider.

36. The delta-sigma modulator of claim 30 wherein the photonic sampler is associated with a photonic impulse source and wherein the photonic sampler comprises a photodetector coupled to receive photonic impulses from the photonic impulse source.

37. The delta-sigma modulator of claim 36 wherein the photonic sampler further comprises a pulse broadener coupled with the photonic sampler.

38. The delta-sigma modulator of claim 30 wherein the digital output signal is coupled with the first node through a low-pass filter connected in series with the digital-to-analog converter.

39. The delta-sigma modulator of claim 30 further comprising:
- a second node, coupled with a second quantizer, the second node producing a second difference signal equal to a difference in magnitude between a second analog signal and a sum of the first integrated signal and the feedback signal; and
- a second integrator, coupled between the first node and the second node, which integrates the second difference signal and produces a second integrated signal, wherein said first analog signal is said second integrated signal.

40. The delta-sigma modulator of claim 39 further comprising: a third node, coupled with a third quantizer, the third node producing a third difference signal equal to a difference in magnitude between a third analog signal and a sum of the second integrated signal and the feedback signal; and a third integrator, coupled between the second node and the third node, which integrates the third difference signal and produces a third integrated signal, wherein said second analog signal is said third integrated signal.

41. The delta-sigma modulator of claim 40 further comprising: a fourth node, coupled with a fourth quantizer, the fourth node producing a fourth difference signal equal to a difference in magnitude between a fourth analog signal and a sum of the third integrated signal and the feedback signal; and a fourth integrator, coupled between the third node and the fourth node, which integrates the fourth difference signal and produces a fourth integrated signal, wherein said third analog signal is said fourth integrated signal.

42. The delta-sigma modulator of claim 30 further including a modulator for modulating the continuous time analog signal whereby the first node produces a difference signal between the modulated continuous time analog signal and the feedback signal, the delta-sigma modulator further including a demodulator for demodulating the digital output signal.

43. The delta-sigma modulator of claim 30 wherein the continuous time analog signal is a coded analog signal.

44. The delta-sigma modulator of claim 43 wherein the coded analog signal is coded according to a Hadamard code.

45. A delta sigma modulator comprising:
plurality of parallel connected circuits, each circuit being connected to receive a continuous time analog signal and comprising:
(i) a modulator for modulating the continuous time analog signal according to a coded sequence to produce a modulated analog signal;
(ii) a first node to produce a difference signal equal to a difference in magnitude between the modulated analog signal and an analog feedback signal generated from a digital signal;
(iii) an integrator, coupled with the first node, to integrate the difference signal, thereby producing a first integrated signal;
(iv) at least one photonic sampler, coupled with the integrator, to sample the first integrated signal, thereby producing a sampled integral signal;
(v) at least one quantizer, coupled with the sampler, to quantize the sampled integral signal, thereby producing the digital signal, an output of the quantizer being coupled to the first node through a digital to analog converter; and
(vi) a digital demodulator for demodulating the digital signal; and
wherein the digital signals produced by said parallel connected circuits are summed at a summing device.

46. A delta sigma-modulator of Y order, where Y is an integer greater than or equal to one, said delta-sigma modulator comprising:
a set of Y nodes, said set of Y nodes being divided into a first subset and a second subset when Y is greater than or equal to two, each node in said set of Y nodes producing a difference signal equal to a difference between a first signal and a second signal, said first signal being equal to an analog input into said delta-sigma modulator when one node in said set of Y nodes is a first node, said second signal being equal to a feedback signal generated from a digital output signal for said first subset of Y node;
a set of Y integrators, said set of Y integrators being coupled with said set of Y nodes, each Y integrator in said set of Y integrators integrating the difference signal from a preceding node in said set of Y nodes, an integrated signal being directed toward a proceeding node from said set of Y nodes until said integrated signal is generated from a last integrator from said set of Y integrators, said last integrator producing a last integrated signal-,
a set of K summer devices, where K is an integer greater than or equal to Y/2, K being equal to zero when Y is equal to 1, each K summer device in said set of K summer devices being connected with said nodes in said second subset of Y nodes, each of said K summer devices combining a feedback signal generated from said digital output signal with the integrated signal from one of said Y integrators in said set of Y integrators;
a photonic sampler, for photonically sampling said last integrated signal and producing a sampled integrated signal;
a quantizer, which quantizes the sampled integrated signal and produces the digital output signal; and
a set of Y digital to analog converters, each Y digital to analog converter in said set of Y digital to analog converters for converting said digital output signal into said feedback signal, a first subset of Y digital to analog converters providing said feedback signals to said first subset of Y nodes, a second subset of Y digital to analog converters providing said feedback signals to said set of K summer devices.

47. The delta-sigma modulator of claim 46 wherein said photonic sampler is an electro-absorptive device.

48. The delta-sigma modulator of claim 47 wherein said electro-absorptive device comprises a plurality of segments of electro-absorptive material coupled with a plurality of segments of non electro-absorptive material.

49. The delta-sigma modulator of claim 48 wherein said electro-absorptive device further comprises a plurality of photodetecting segments with fixed absorbency coupled with at least a subset of said plurality of segments of non electro-absorptive material.

50. A method for improving a delta-sigma modulator comprising the steps: integrating an analog input signal producing an integrated analog input signal; and optically sampling said integrated analog input signal to produce an optically sampled integrated signal, wherein said step of optically sampling comprises a step of varying the absorbency of an electro-absorptive device.

* * * * *